United States Patent [19]

Gelorme et al.

[11] Patent Number: 4,882,245

[45] Date of Patent: Nov. 21, 1989

[54] PHOTORESIST COMPOSITION AND PRINTED CIRCUIT BOARDS AND PACKAGES MADE THEREWITH

[75] Inventors: Jeffrey D. Gelorme, Binghamton, N.Y.; Robert J. Cox, Watsonville; Sergio A. R. Gutierrez, San Jose, both of Calif.

[73] Assignee: International Business Machines Corporation, Armonk, N.Y.

[21] Appl. No.: 62,360

[22] Filed: Jun. 12, 1987

Related U.S. Application Data

[63] Continuation of Ser. No. 791,886, Oct. 26, 1985, abandoned.

[51] Int. Cl.⁴ .................... G03C 1/72; A01B 9/00; H02B 1/00
[52] U.S. Cl. .................... 430/14; 430/280; 430/18; 430/271; 430/275; 522/170; 428/195; 428/201; 428/901; 428/209; 428/332; 428/220; 174/68.5; 361/379; 361/412
[58] Field of Search .................. 430/280, 14, 18, 271, 430/275; 428/195, 201, 901, 209, 332, 220; 522/170; 174/68.5; 361/379, 412

[56] References Cited

U.S. PATENT DOCUMENTS

| | | | |
|---|---|---|---|
| 3,794,576 | 2/1974 | Watt | 430/280 X |
| 3,826,650 | 7/1974 | Schlesinger | 522/170 |
| 3,900,325 | 8/1975 | Christensen et al. | 96/91 D |
| 4,113,497 | 9/1978 | Schlesinger | 96/115 P |
| 4,138,255 | 2/1979 | Crivello | 96/35.1 |
| 4,173,476 | 11/1979 | Smith et al. | 430/280 |
| 4,175,963 | 11/1979 | Crivello | 430/296 |
| 4,186,108 | 1/1980 | Carlson et al. | 252/426 |
| 4,193,799 | 3/1980 | Crivello | 430/319 |
| 4,227,978 | 10/1980 | Barton | 204/159.12 |
| 4,231,886 | 11/1980 | Carlson | 252/117 |
| 4,231,951 | 11/1980 | Smith et al. | 260/446 |
| 4,237,216 | 12/1980 | Skarvinko | 430/280 |
| 4,245,029 | 1/1981 | Crivello | 430/280 |
| 4,272,607 | 6/1981 | Tsukada et al. | 430/905 |
| 4,273,668 | 6/1981 | Crivello | 252/182 |
| 4,299,938 | 11/1981 | Green et al. | 522/170 X |
| 4,308,118 | 12/1981 | Dudgeon | 204/159.11 |
| 4,318,766 | 3/1982 | Smith | 156/330 |
| 4,374,751 | 2/1983 | Dudgeon | 252/426 |
| 4,378,277 | 3/1983 | Smith | 204/159.18 |
| 4,394,403 | 7/1983 | Smith | 427/42 |
| 4,429,034 | 1/1984 | Keane et al. | 429/032 |
| 4,518,676 | 5/1985 | Irving | 522/170 X |
| 4,659,649 | 4/1987 | Dickinson | 430/280 |

Primary Examiner—Paul R. Michl
Assistant Examiner—Cynthia Hamilton
Attorney, Agent, or Firm—Shelley M. Beckstrand; Maurice H. Klitzman

[57] ABSTRACT

A photocurable composition which is useful as a permanent resist in the manufacture of printed circuit boards and packages of such boards comprises a multifunctional epoxidized resin, a reactive diluent, a cationic photoinitiator and, optionally, an exposure indicator, a coating aid and a photosensitizer.

16 Claims, 1 Drawing Sheet

PHOTORESIST COMPOSITION AND PRINTED CIRCUIT BOARDS AND PACKAGES MADE THEREWITH

This is a continuation of application Ser. No. 791,886, filed Oct. 26, 1985, and now abandoned.

BACKGROUND OF THE INVENTION

1. Field of the Invention

This invention relates generally to photoresist compositions and more specifically to photoresist compositions for use in the manufacture of printed circuit boards and packages of printed circuit boards.

2. Prior Art

Printed circuit boards and their manufacture using photoresists as negative masks during conductive metal plating processes are not new.

Printed circuit board designs using a "permanent" resist are also known. A permanent resist is a negative plating mask which is not removed from the printed circuit board substrate after plating, but rather becomes a part of the printed circuit board structure. Permanent resist printed circuit boards are described, for example, in U.S. Pat. No. 3,982,045 issued Sept. 21, 1976 to Kukanskis.

Attempts to manufacture useful permanent resists and printed circuit boards and packages using such a resist have uncovered a number of difficulties. One such difficulty is that there has not heretofore been available a UV-sensitive photoresist material which can be coated onto a substrate at cross-sectional heights of at least about 0.0015 inch and which will resist delamination in response to temperature cycling.

One reason for the desirability of printed circuit boards of the permanent resist design is that they will present a relative smooth surface if the pattern of conductive material and the pattern of photoresist material have substantially the same cross-sectional height. However, in the past there has not been available a photoresist material capable of being coated onto a substrate to a cross-sectional height of at least about 0.0015 inch and of maintaining that height without delamination during processing and use.

It has also been a problem that permanent resist materials which were previously available tended to delaminate from substrates after temperature cycling. There has been a need in the printed circuit board industry for a permanent resist material which will not delaminate after temperature cycling.

The delamination problems have also tended to frustrate commercialization of packages containing permanent resist printed circuit boards. There is a need for a permanent resist material which will enable the manufacture of packages containing two or more permanent resist printed circuit boards which will not delaminate in response to temperature cycling.

SUMMARY OF THE INVENTION

It is, therefor, an object of the present invention to overcome the disadvantages of the prior art.

It is another object of the present invention to provide a composition which is curable to a resinous material and which, prior to curing, can be coated onto a substrate to a thickness of at least about 0.0015 inch in a layer which is non-brittle and non-distortable.

It is a further object of the present invention to present a composition which is useful as a permanent resist on printed circuit boards.

It is still another object of the present invention to achieve a resist material which will not easily delaminate from an epoxy resin-containing substrate in response to temperature cycling.

It is also an object of the present invention to achieve a material which is capable of imagewise curing in response to imagewise exposure and of subsequent development with a chlorinated solvent.

It is yet another object of the present invention to enable to manufacture of packages of at least two permanent resist printed circuit boards, which packages will resist delamination.

These and other objects are accomplished by the present invention which, in one aspect, is a photocurable composition comprising:

(a) an epoxyfunctional resin which is capable of being cured by the action of a cation-producing photoinitiator:

(b) a reactive diluent for (a) which is soluble in developing solvents for photoresists;

(c) a cationic photoinitiator;

(d) optionally, an indicator which changes color in response to radiation and which can crosslink with (a) during curing;

(e) optionally, a coating aid; and (f) optionally, a photosensitizer; wherein (a) comprises at least about 65 wt. % of the resin solids and is dissolved in a suitable solvent, (b) comprises from about 10 to about 35 wt. % of the resin solids, (c) is present in an amount of from about 2 to about 6 parts per 100 parts by wt. of resin and is dissolved in a suitable solvent, (d) is present in an amount of from 0 to about 5 wt. % resin solids, (e) is present in an amount of from 0 to about 0.5 parts per 100 parts resin and (f) is present in an amount of from 0 to about 1 wt. % based on the weight of the resin solids.

In another aspect, the invention relates to a printed circuit board which comprises an epoxy resin-containing substrate on which is disposed an imagewise pattern of the cured composition described above. A package of at least two such printed circuit boards cured in layered configuration is also contemplated by the present invention.

In yet another aspect, the invention relates to a method of making the composition described above which comprises the steps of:

(1) dissolving (a) in a solvent which will dissolve substantially all of (a) which is not partially crosslinked in an amount which will comprise at least about 65 wt. % of the resin solids in the composition;

(2) filtering the solute from step (1) to remove any partially crosslinked (a);

(3) adding from about 10 to about 35 wt. % resin solids of (b) and from about 2 to about 6 parts per 100 parts resin of (c) with stirring; and, optionally, (4) adding a suitable solvent to adjust the viscosity of the composition to from about 600 to about 2,000 centipoise.

In still another aspect, the present invention relates to an improvement in a method of making a printed circuit board which comprises the steps of:

(A) coating a photocurable resin composition onto a substrate;

(B) exposing the coating on the substrate to an imagewise pattern of radiation to which the composition is responsive in an amount sufficient to at least partially cure the composition, which imagewise pattern is the negative image of a desired printed circuit pattern;

(C) developing the exposed composition with a solvent which will dissolve the non-exposed areas of the coating;

(D) advancing the cure of the developed imagewise coating; and (E) depositing a conductive material on the portions of the substrate which are not covered by the developed imagewise coating in order to form a partially cured printed circuit board construction;

wherein the improvement comprises, in step (A), the coating of the composition of Claim 1 onto an epoxy-containing substrate to a thickness of at least about 0.0015 inch and the additional step of:

(F) further curing the construction of step (E) to a point at which the coefficient of thermal expansion in the z axis of the fully cured imagewise coating and the epoxy resin-containing substrate are substantially the same.

BRIEF DESCRIPTION OF THE DRAWINGS

The invention will be described with reference to the accompanying drawings in which.

DETAILED DESCRIPTION OF THE INVENTION

Figure 1:
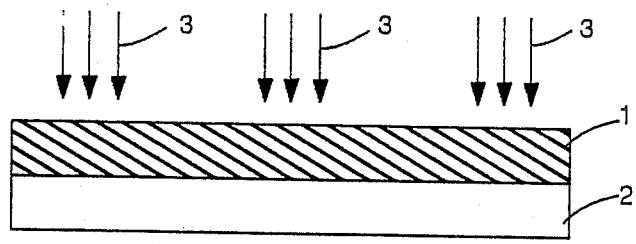
FIG. 1 shows the composition of the present invention coated onto a substrate and subjected to imagewise radiation.

It has been discovered that the composition of the present invention, described above, which is curable in response to imagewise radiation, can be coated onto a substrate at thicknesses of at least about 0.0015 inch in a non-brittle, non-distortable layer, thus overcoming one problem of the prior art as described above.

It has also been discovered that the composition can be fully cured such that when curing takes place in contact with an epoxy resin-containing substrate the coefficient of thermal expansion of the substrate and the cured composition will be substantially the same in the z axis, thus overcoming the delamination problem of the prior art described above.

It has also been discovered that printed circuit boards comprising the permanent resist composition of the present invention can be fully cured in layered configuration to form a package which resists delamination.

The composition of the present invention requires as component (a), an epoxyfunctional resin which is capable of being partially cured to a resinous state by the action of a cation-producing photoinitiator. Curing is by a ring opening addition reaction of epoxy moieties which is initiated by cations produced when the photoinitiator is struck by activating radiation. Such reactions are already well known in the resin technology.

Any useful such epoxyfunctional resin may be employed in the present invention. However, in order to function satisfactorily, the resin should have at least two epoxy groups, and preferably more.

Good results have been obtained using an octafunctional epoxidized novalac as (a), and such a resin is preferred. The octafunctional epoxidized novalac is commercially available from Celanese Resins under the tradename SU-8. It will be readily apparent to one of ordinary skill in the resin technology that other such multifunctional epoxy containing resins will be useful in the present invention. Such other useful resins are within the intended scope of the appended claims.

Component (a) should be present in an amount of at least about 65 wt. % resin solids. The solvent in which (a) is provided, such as a ketone, is not taken into account when determining the concentration of (a). Concentrations of (a) of less than about 65 wt. %, when coated on substrates, form coatings which are too soft to be useful. It is preferred that (a) be present in an amount of from about 78 wt. % resin solids to about 83 wt. % resin solids. Concentrations of (a) of less than about 78 wt. % begin to form coatings which, when cured, are softer than is preferred. Concentrations of (a) greater than about 83 wt. % have been found to result in cured coatings which are undesirably brittle.

Component (b) may be any reactive diluent which is effective as a plasticiser for (a). Reactive diluent, as used herein, is understood to mean a diluent which will react or crosslink with (a) during curing. Suitable materials are, for example cycloalaphatic epoxides, although other suitable reactive diluents will readily come to mind to those of ordinary skill in resin technologies. Such other materials are within the intended scope of the appended claims.

Good results have been obtained using cycloalaphatic epoxides such as 3,4 epoxycyclohexylmethyl-3,4 epoxycyclohexyl carboxylate and 7-oxabicyclo(4.1.0-)heptane-3-carboxylic acid, 7-oxabicyclo(4.1.0)hept-3-glmethyl ester. Such materials are commercially available from Ciba Geigy under the tradename CY 179 and from Union Carbide under the tradename ER 4221.

Component (b) should be present in a concentration which will constitute from about 10 to about 35 wt. % of the resin solids in the composition. It has been found from experimentation that if less than about 10 wt. % of (b) is present the resulting cured composition will be undesirably brittle and that if more than about 35 wt. % is present the resulting cured composition will be undesirably soft.

A preferred range of (b) is from about 12 to about 17 wt. % of the resin solids, depending on the relative softness or brittleness which is desired in the final composition.

Component (c) may be any photoinitiator which produces cations acids upon exposure to radiation. The cations must be produced in amounts sufficient to cause curing of (a).

One group of cationic photoinitiators which are useful in the present invention as component (c) are triarylsulphonium salts. The use of such salts as photoinitiators is known from, for example, U.S. Pat. No. 4,245,029, issued Jan. 13, 1981, to Crivello.

One suitable such photoinitiator is a product available from General Electric Company under the tradename UVE 1014, which comprises a mixture of triarylsulphonium hexafluoro antimonate and thio phenoxy triaryl sulphonium hexafluoro antimonate in a propylene carbonate solvent. It will be readily apparent to those of ordinary skill in the resin curing technology that other such cationic photoinitiators will be useful in the present invention and are within the intended scope of the appended claims.

Component (c) should be present in the composition of the present invention in an amount of from about 2 to about 6 parts (not counting the solvent) per 100 parts of resin. It has been found from experimentation that concentrations of (c) less than about 2 parts per 100 parts of resin will result in a composition which takes undesirably long to cure upon exposure to radiation.

It has been observed that concentrations of (c) greater than about 6 parts per 100 parts resin results in a composition which is not developable by chlorinated solvents. When the composition of the present invention is to be used as a photoresist in the manufacture of printed circuit boards it is important that portions of the composition which are not struck by radiation be dissolvable in chlorinated solvents in order to develop the pattern of the cured, radiation struck portions.

Optionally, the composition of the present invention may include an indicator (d) to help determine which portions of the composition, have been struck by radiation. Any useful such indicator which will crosslink with (a) during curing can be incorporated. One suitable indicator which has been used is epoxidized trishydroxyphenylmethane, which is commercially available from Dow Chemical under the tradename XD 7342. It will be readily apparent to those of ordinary skill in the resin curing technology that any such indicator may be used and that all useful such indicators are intended to be within the scope of the appended claims.

Component (d), may be present in amounts of from 0 to about 5 wt. % of resin solids. The trishydroxyphenylmethane indicator described above changes color when it has been struck by radiation of the wavelength which will cause the composition to cure. Thus, technicians working with the composition can tell which portions of the composition should be cured. It has been observed that amounts of (d) greater than about 5 wt. % cause the cured image to lose resolution and increase the photoexposure time undesirably.

A second optional component (e) is a surfactant coating aid. The purpose of the coating aid is to produce an even thickness of film across a surface and to prevent defects in the an end product, such as a printed circuit board which might be caused by non-wetting of the surface. Any useful such coating aid my be employed. One suitable coating aid is a non-ionic surfactant (a fluorinated hydrocarbon) available from the 3M Company under the tradename FC 430. It will be readily apparent to those of ordinary skill in the coating technology that any suitable such coating aid may be used and will be within the intended scope of the appended claims.

Component (e) may be present in amounts up to about 0.5 parts per 100 parts resin. It has been observed that higher concentrations of the surfactant coating aids results in a coated composition which is undesirably slippery.

A photosensitizer (f) is also an optional component. Any photosensitizer which is useful to cause the photoinitiator to absorb more light is suitable. Good results have been obtained using anthracene, perylene and mixtures thereof, although other useful photocatalysts may come to mind to those of ordinary skill in the resin curing technology.

The first step in making the composition of the present invention is the pre-dissolving of component (a) in a suitable solvent. Any solvent which will dissolve any of (a) which is not partially crosslinked can be used. Useful solvents have been found to be methyl isobutyl ketone, methyl ethyl ketone and mixtures thereof, although other suitable solvents will readily come to mind to those of ordinary skill in resin technologies. The amount of solvent used should be at least enough to dissolve the desired amount of non-partially crosslinked component (a)

It is important to the eventual use of the composition as a photoresist in the manufacture of printed circuit boards that the second step of filtering any partially crosslinked (a) from the solute be accomplished. If this step is not accomplished, portions of the unexposed composition will not be soluble in some chlorinated solvents, and the photoresist material will not be as easily developable.

Filtering through a 10 micron porous membrane filter has been found to be adequate for the preparation of a composition which will be useful as a photoresist.

After filtering, from about 10 to about 35 wt. % resin solids of (b) and from about 2 to about 6 parts per 100 parts resin of (c) are added with stirring. The sequence of addition is not critical, and any method of stirring can be used.

As an optional step, additional solvent may be added in order to adjust the viscosity of the composition. The composition of the present invention may have any viscosity; however, when it is intended for eventual use as a photoresist in the manufacture of printed circuit boards, it is desirable that the composition have a viscosity of from about 600 to about 2,000 centipoise. Although any suitable solvent may be used for adjusting the viscosity, it is preferable to use a solvent which is at least similar to the one used to solubilize (a).

A photocatylist (f) may be added as an optional component when (b) and (c) are added. As described above, the photocatylist can be added in amounts up to about 1 wt. % of the resin solids.

Optional components (d) and (e) may also be added to the composition with components (b) and (c). The addition of optional component (d) has been observed to increase the required stirring time of the composition.

As has been indicated above, the composition of the present invention is useful as a permanent photoresist on a printed circuit board. In such use composition 1 is coated on substrate 2 in FIG. 1. Best results are obtained when the substrate is a partially cured epoxy resin-containing material such as epoxy resin coated glass cloth, commonly known as pre-preg in the printed circuit board technology. The composition, when fully cured, substantially matches the coefficient of thermal expansion of such a substrate, which is also fully cured, in the z axis between about ° C. and 100° C. to minimize delamination during use. As used herein, substantial matching of the coefficient of thermal expansion of the epoxy resin-containing substrate and the composition of the present invention means that in the z axis the relative difference between the expansion of the composition and the substrate over 100° C. is less than about 300 micro inches per inch per °C.

The process of using the composition as a permanent photoresist begins with the step of coating the composition onto such a suitable substrate. The method of coating is not critical and may be by any suitable technique, many of which are known to those of ordinary skill in the coating technology. However, it is an important advantage of the composition of this invention that it can be coated to thicknesses of 0.0015 inch and greater. Coatings of such thicknesses are important in the manufacture of printed circuit boards having permanent resist designs. The discovery of a material which can be coated to such thicknesses overcomes a serious problem of the prior art in the industrialization of the permanent resist technology, as discussed above.

For example, the composition may be placed directly on a substrate by a wiping or doctoring technique or by the use of a coating nozzle. However, a more preferred method is to first coat the composition onto a carrier medium, such as Mylar film, and then to remove solvent by heating or heating in the presence of vacuum until a coating of the desired thickness has been achieved on the carrier medium. An advantage of this preferred method of coating is that the layer of composition on the carrier medium can then be stored until it is needed for use on a substrate. The rheology of the composition on the carrier medium, after some of the solvent has been dried off is such that the carrier medium can be rolled for convenient storage. The non-brittle, non-distortable nature of a layer of the present composition is important in enabling the use of a carrier layer. The parallel plate $T_g$ of the composition should be between 25° C. and 40° C. in order for the carrier layer method of coating to work well. In this preferred method, component (d) has been found useful in helping achieve the $T_g$ range mentioned above.

In this preferred method of coating the composition on the substrate, the composition is transferred from the carrier medium to the substrate by the use of a heated nip roller arrangement or by the use of a heated vacuum laminator. Both such techniques are well known in the coating technology. After lamination of the coating to the substrate, the carrier medium is stripped away, although stripping does not have to take place at once. The coated substrate can be stored with the carrier medium still covering the coating, if desired.

After the carrier medium is removed, or alternatively after doctor blade coating, the coating on the substrate is exposed to an imagewise pattern of radiation 3 to which it is responsive. The composition described above is responsive to ultraviolet radiation having a wavelength of less than about 500 nm in an amount sufficient to cause the release of Lewis or Bronstead acids from component (c). It has been observed that good results are obtained when the radiation provides at least about 200 milli Joules of energy to the coating.

If optional component (d) is present in the composition, it will change color in the radiation-struck areas so that a technician can inspect the pattern of exposure. In the manufacture of printed circuit boards, the exposure is typically a negative image of the desired conductive circuit pattern. A colored pattern in the composition, when it is used as a photoresist as described above, will indicate at least partial crosslinking in the colored areas.

The exposed coating is subsequently developed by exposure to a suitable solvent. A suitable solvent is one which will solubilize non-crosslinked or non-partially crosslinked component (a), but which is incapable of dissolving crosslinked or partially crosslinked component (a). The most typical solvents for use in developing photoresists after exposure are chlorinated solvents, such as 1,1,1-trichloroethane. The particular solvent used is not critical to the invention. Other useful solvents will come to mind to those of ordinary skill in the printed circuit board manufacture technology, and such solvents are within the intended scope of the appended claims.

Figure 2:
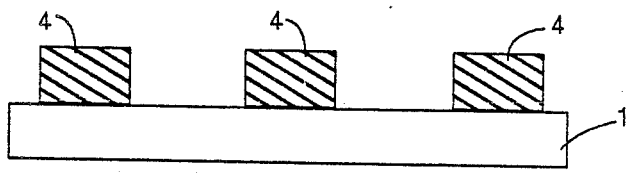
FIG. 2 shows a substrate supporting an imagewise pattern of permanent resist material.

The development of the exposed composition will leave an imagewise coating of partially crosslinked composition on the surface of the substrate. After development the cure of such an imagewise coating 4 in FIG. 2 is advanced in order to further harden it and to enhance its subsequent use as a resist in metal plating baths. Advancing of the cure of the imagewise resist pattern is accomplished by applying either heat or light energy. At least about 2 Joules of light energy to which the composition is responsive has been found to be sufficient for this step. Alternatively, heating the substrate and imagewise coating to at least about 100° C. for at least about 10 minutes has been found to provide sufficient energy to advance the cure of the imagewise resist coating.

Figure 3:
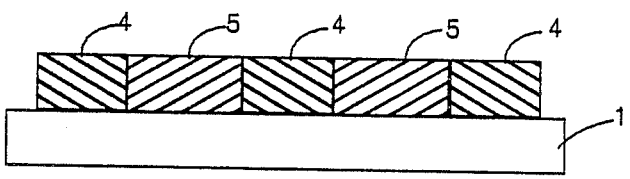
FIG. 3 shows the construction of FIG. 2 with conductive material deposited on the substrate.

A conductive material 5 in FIG. 3 is then deposited on substrate 1 in the areas not masked by the imagewise photoresist coating 4. Deposition of conductive material 5, which is normally copper, is usually accomplished by use of an electroless metal plating bath, which may be followed by use of an electorlytic metal plating bath. By operation of the baths, the use of which are well known in the printed circuit board manufacturing technology, a conductive metal is deposited on the substrate in the areas not protected by the imagewise photoresist pattern so that a pattern of conductive material is deposited on the substrate in a positive image of a desired printed circuit.

It is sometimes desirable that the resist material then be removed from the printed circuit board to leave the conductive pattern on the substrate. However, in other applications, it is desirable for the resist to remain on the printed circuit board. In such uses, the photoresist material is known as permanent resist and such printed circuit boards are known as permanent resist printed circuit boards.

When permanent resist is desired, the imagewise composition may be further cured after the step of depositing the conductive material. Further curing is normally done by heating because of the impractability of supplying sufficient energy as actinic radiation. Good results have been obtained in the present invention by heating the printed circuit board to at least about 175° C. for at least about an hour.

It is an important advantage of the composition and method of the present invention that, after such further curing, the composition will have a coefficient of thermal expansion in the z axis which is substantially the same as that of epoxy resin-coated glass cloth which is normally used as a substrate for printed circuit boards. This advantage overcomes serious problems of delamination of permanent resists, as is described above.

Figure 4:
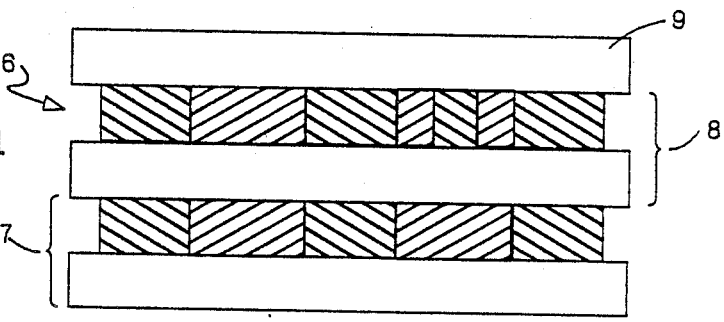
FIG. 4 shows a package of two constructions of FIG. 3 in layered configuration to form a package.

A printed circuit board manufactured by the process described above and using the composition of the present invention is intended to be within the scope of the present invention. Such a circuit board may be of the permanent resist design, and, as such, will have the advantage of a reduced tendency to delaminate because of the substantial similarity of the coefficient of thermal expansion in the z axis of an epoxy resin-containing substrate and the resist material A package 6 of FIG. 4 of two or more permanent resist printed circuit board constructions 7 and 8 may be made by further curing them together under pressure, sometimes with an enclosing layer 9. Enclosing layer 9 should preferably be of partially cured epoxy resin containing material so that it will more readily match the curing characteristics of the other components of package 6, although any useful material can be employed. Further curing of package 6 should be done under a pressure of from about 200 to about 500 psi and preferably at about 300 psi. It should be understood that packages of more than two layers of constructions such as 7 and 8 are contemplated.

The invention is illuminated and illustrated in its various aspects by the following examples, which are not intended to be limiting.

EXAMPLE 1

Eighty-eight g. of SU-8, which is an octafunctional epoxidized novalac available from Celanese Resins, was mixed with 100 g. methylethyl ketone and filtered using 10 micron filter paper before 12 g. of CY 179, a cycloalaphatic epoxide available from Ciba Geigy, was added with stirring. 4.0 g. of UVE 1014, a triarylsulphonium salt (50% solution) available from General Electric, was added in yellow light.

The resulting composition was coated onto a partially cured epoxy resin coated glass cloth substrate using a doctor blade and checked for thickness at various locations using a micrometer. Average thickness was about 0.0018 inch with a variance of plus or minus 0.0003 inch. Parallel plate rheology was used to determine that the $T_g$ of the coated composition was 40 −43° C. (+/−3° C.).

Imagewise exposure of the coating was made using an Oriel 560 UV generator and a Stouffer resolution guide, after which the coating was developed with 1,1,1-trichloromethane to reveal a crosslinked pattern of resist corresponding to the UV radiation struck areas. Cure of the resist pattern was advanced by baking in an oven at 100° C. for 10 minutes.

The resist imaged substrate was immersed in a Shipley electroless plating bath until a conductive layer was built up on the portions not protected by the substrate. The resist was observed to remain intact. The construction was further cured in an oven at 175° C. for one hour before the resist was tested on a Perkin Elmer thermomechanical analyzer (TMA) to determine change in the z axis during cycling between 0° and 100° C. Test results indicated less that 100 microinches/inch/°C. change. Multiple cyclings over a period of time failed to cause delamination.

EXAMPLE 2

The procedure of Example 1 was repeated using 80 wt. % resin solids SU-8 and 20 wt. % resin solids CY 179 to form a composition which was suitable for coating on a substrate with a doctor blade, but which had too low a $T_g$ (about 20° C.) to use in the carrier layer coating technique. Once coated, the material functioned substantially as in Example 1.

EXAMPLE 3

The procedure of Example 1 was repeated using 88 wt. % SU-8 and 12 wt. % CY 179 to form a composition which could be coated onto a substrate using a doctor blade but which was too brittle ($T_g$ 45° C.) to be used in the above described carrier layer coating technique. Once coated by the doctor blade technique, however, the composition functioned substantially as in Example 1.

EXAMPLE 4

The procedure of Example 1 was followed using 65 wt. % resin solids SU-8 and 35 wt. % resin solids CY 179 to achieve a composition having a $T_g$ of 20° C. and not being useful in the carrier layer coating method. However, after coating on the substrate with a doctor blade, the material functioned substantially as in Example 1.

EXAMPLE 5

The procedure of Example 1 was followed using 85 wt. % resin solids SU-8 and 15 wt. % resin solids CY 179. The resulting material had a good hardness, but was found to distort substantially and was not useful in the carrier layer transfer method. The composition functioned substantially as the composition of Example 1 after coating on a substrate with a doctor blade.

EXAMPLE 6

In this comparative example, 70 wt. % resin solids SU-8 was used with 10 wt. % resin solids XD7342, an epoxydized trishydroxyphenylmethane available from Dow Chemical Co., and 15 wt. % resin solids CY 179 was used in the procedure of Example 1. The resulting composition, which had a $T_g$ below 25° C. was not soluble in chlorinated solvents and could not be developed.

EXAMPLE 7

The procedure of Example 1 was followed using 80 wt. % resin solids SU-8, 5 wt. % resin solids XD7342 and 15 wt. % resin solids CY 179. The composition had a $T_g$ of 35° C. and was capable of being coated onto a Mylar film using a doctor blade, dried to remove solvents and then coated onto a substrate using a heated nip roller. The composition performed substantially the same as did the composition of Example 1.

EXAMPLE 8

The procedure of Example 1 was followed except that the optional components listed below were added in the amounts shown to produce the results shown:
(a) fluorinated hydrocarbon. 0.5 parts/100 parts resin solids. smoother coating achieved.
(b) fluorinated hydrocarbon. 1 parts/100 parts resin solids (comparative example). smooth coating, but oily resin surface.
(c) perylene. 0.5 parts/100 parts resin solids. 75% less UV radiation required for imagewise exposure.
(d) anthracene. 1 part/100 parts resin solids. 34% less UV radiation required for imagewise exposure.

EXAMPLE 9

The procedure of Example 1 was followed except that the resin/solvent solution was not filtered in this comparative example. Upon development, it was observed that undeveloped deposits of partially crosslinked material remained in the non radiated areas.

EXAMPLE 10

The procedure of Example 1 was followed except that before further curing, two such constructions were layered together and enclosed on the side having the exposed patterns of circuitry with a partially cured epoxy resin containing substrate material to form a package. Further curing of the package was then accomplished at 175° C. for one hour while the package was subjected to a pressure of about 300 psi.

The procedure was repeated at 150, 200, 500 and 700 psi. No delamination and acceptable TMA results (below 300 microinches/in/°C.) were noted for samples further cured at 200 psi and 500 psi. At 700 psi image distortion was noted and at 150 psi insufficient adhesion between layers was noted.

The present invention has been disclosed in the above teachings and in the accompanying drawings with sufficient clarity and conciseness to enable one skilled in the art to make and to use the invention, to know the best mode for carrying out the invention and to distinguish it from other inventions and from what is old. Many variations and obvious adaptations of the invention will readily come to mind and these are intended to be contained within the scope of the invention as claimed below.

What is claimed is:

1. A printed circuit board comprising a fully cured epoxy-resin-containing substrate, a pattern of conductive material disposed on said substrate, and an imagewise pattern of a fully cured photocurable composition disposed on said substrate;

said fully cured photocurable composition resulting from a reaction between a photocurable composition and a cationic photoinitiator;

said photocurable composition comprising the product of:

(a) a polyepoxyfunctional novolak resin which is curable through the action of said cationic photoinitiator; and (b) a diluent soluble in developing solvents for photoresists and reactive with the epoxy functional groups of said epoxy novolak resin by the action of said cationic photoinitiator to form said fully cured composition insoluble in said developing solvents;

wherein said epoxy novolak resin comprises at least approximately 65 weight percent of the resin solids of said photocurable composition, said diluent comprises from approximately 10 to approximately 35 weight percent of said resin solids, and said cationic photoinitiator comprises from approximately 2 to approximately 6 weight percent of said resin solids;

said fully curved photocurable composition being at least approximately 0.0015 inch in cross sectional height; and said fully cured photocurable composition being substantially resistant to delamination from said substrate when temperature cycled.

2. A package comprising at least 2 printed circuit boards according to claim 1; said circuit boards having been fully cured in layered contact.

3. The package of claim 2 which additionally comprises at least one enclosing layer.

4. The package of claim 3 wherein the enclosing layer includes an epoxy containing resin.

5. The printed circuit board as in claim 1 wherein said epoxy novolak resin has an average of about eight epoxy functional groups.

6. The printed circuit board as in claim 5 wherein said diluent is a cycloaliphatic epoxide.

7. The printed circuit board as in claim 1 wherein said diluent is a cycloaliphatic epoxide.

8. The printed circuit board as in claim 7 wherein said diluent is 3,4 epoxycyclohexmethyl-3,4 epoxycyclohexyl carboxylate.

9. The printed circuit board as in claim 6 wherein said diluent is 3,4 epoxycyclohexylmethyl-3,4 epoxycyclohexyl carboxylate.

10. The printed circuit board as in claim 7 wherein said diluent is 7-oxabicyclo(4.1.0)heptane3-carboxylic acid, 7-xoabicyclo(4.1.0)hept3)ylmethyl ester.

11. The printed circuit board as in claim 6 wherein said diluent is 7-oxabicyclo(4.1.0)heptane-3-carboxylic acid, 7-oxabicylo(4.1.0)hept-3-ylmethyl ester.

12. The printed circuit board as in claim 1 wherein said photoinitiator is a triarylsulphonium salt or mixtures of such salts.

13. The printed circuit board as in claim 12 wherein said photoinitiator is a triarylsulphonium hexafluoro antimonate and thio phenoxy triarylsulphonium hexafluoro antimonate.

14. The printed circuit board as in claim 1 wherein said epoxy novolak resin comprises approximately 78 to approximately 83 weight percent of said resin solids.

15. The printed circuit board as in claim 14 wherein said diluent comprises from about 12 to about 17 weight percent of said resin solids.

16. The printed circuit board as in claim 15 where said cationic photoinitiator comprises about 4 weight percent of said resin solids.

* * * * *